United States Patent [19]

Nawa et al.

[11] Patent Number: 5,130,573
[45] Date of Patent: Jul. 14, 1992

[54] SEMICONDUCTOR INTEGRATED CIRCUIT HAVING ECL CIRCUITS AND A CIRCUIT FOR COMPENSATING A CAPACITIVE LOAD

[75] Inventors: Takanori Nawa, Inuyama; Naomi Mori, Kuwana; Hideji Sumi, Kani, all of Japan

[73] Assignee: Fujitsu Limited, Kawasaki, Japan

[21] Appl. No.: 616,947

[22] Filed: Nov. 21, 1990

[30] Foreign Application Priority Data

Nov. 21, 1989 [JP] Japan .................................. 1-302938

[51] Int. Cl.[5] .................................. H03K 19/086
[52] U.S. Cl. .................................. 307/455; 307/475; 307/466; 307/356
[58] Field of Search ............... 307/475, 455, 466, 467, 307/356, 357

[56] References Cited

U.S. PATENT DOCUMENTS

| | | | |
|---|---|---|---|
| 3,723,761 | 3/1973 | Masaki | 307/455 |
| 4,135,103 | 1/1979 | Fulkerson | 307/455 |
| 4,435,654 | 3/1984 | Koide | 307/455 |
| 4,477,740 | 10/1984 | Takeda | 307/475 |
| 4,593,205 | 6/1986 | Bass et al. | 307/467 |

FOREIGN PATENT DOCUMENTS

| | | |
|---|---|---|
| 0153774A1 | 2/1985 | European Pat. Off. . |
| 2827067 | 1/1979 | Fed. Rep. of Germany ...... 307/467 |
| 60-70821 | 4/1985 | Japan . |

OTHER PUBLICATIONS

B. Abilevitz, IBM Technical Disclosure Bulletin, Apr. 1982, pp. 6052-6053, Armonk, N.Y., US.

Primary Examiner—Stanley D. Miller
Assistant Examiner—Scott A. Ouellette
Attorney, Agent, or Firm—Staas & Halsey

[57] ABSTRACT

A semiconductor integrated circuit includes an emitter-coupled logic circuit coupled between a first power source line and a second power source line. The emitter-coupled logic circuit has a differential circuit and an output buffer circuit. A wiring line is provided which is coupled to the emitter of a first transistor of the output buffer circuit and which carries an output signal of the emitter-coupled logic circuit to a circuit of the next stage. The semiconductor integrated circuit also includes a second transistor having an emitter coupled to the emitter of the first transistor, a collector coupled to the first power source line, and a base supplied with a second reference voltage, and a constant-current source coupled to the emitter of the first and second transistors and allowing a constant current to selectively pass through either the first transistor or the second transistor. A current switching circuit is formed by the first and second transistors and the constant-current source, and the constant current passes through either the first transistor or the second transistor on the basis of a potential of the base of the first transistor and the second reference voltage applied to the base of the second transistor.

12 Claims, 5 Drawing Sheets

SEMICONDUCTOR INTEGRATED CIRCUIT HAVING ECL CIRCUITS AND A CIRCUIT FOR COMPENSATING A CAPACITIVE LOAD

BACKGROUND OF THE INVENTION

The present invention generally relates to a semiconductor integrated circuit having emitter-coupled logic (ECL) circuits, and more particularly to a circuit for compensating for a capacitive load coupled to an interconnection (wiring) line mutually connecting ECL circuits.

An ECL circuit is used as a logic circuit capable of processing a signal at a high speed. Referring to FIG. 1, there is a conventional semiconductor integrated circuit having ECL circuits 1 coupled between a high-potential side power source line $V_{CC}$ and a low-potential side power source line $V_{EE}$. Each of the ECL circuits 1 is composed of a differential circuit 1a and an output buffer circuit 1b. The differential circuit 1a is composed of current switch resistors R1, R2 and R3, emitter-coupled transistors Tr1 and Tr2 and a constant-current source I1. The output buffer circuit 1b is composed of an emitter follower transistor Tr3 and a constant-current source I2. A plurality of ECL circuits are cascaded.

During operation, when an input voltage Vin1 to the ECL circuit 1 illustrated on the left side of the drawing becomes higher than a reference voltage Vref1 and becomes equal to a logically high level, an output voltage Vefb of the differential circuit 1a is switched to a high level. Then, an output voltage of the output buffer circuit 1b is switched to a high level which is lower than the potential Vefb by a base-emitter voltage of the emitter follower transistor Tr3. On the other hand, when the input voltage Vin1 becomes lower than the reference voltage Vref1 and becomes equal to a logically low level, the output voltage Vout1 is switched to a low level which is lower than the potential Vefb by the base-emitter voltage of the emitter follower transistor Tr3.

When the output voltage Vout1 is at the high level, an input voltage Vin2 to the ECL circuit 1 of the next stage, that is, the base voltage of the transistor Tr1 is at the high level, which is higher than a reference voltage Vref2 applied to the base of the transistor Tr2 of the next stage. Thereby, an output voltage of the output buffer 1b of the ECL circuit 1 of the next stage becomes the high level. On the other hand, when the output voltage Vout1 is at the low level, the input voltage Vin2 is at the low level, which is lower than the reference voltage Vref2. Thereby, the output voltage Vout2 of the output buffer circuit 1b of the next stage becomes the low level.

That is, signal transmission between the ECL circuits 1 is carried out via the output voltage Vout1. As shown in FIG. 1, a wiring load capacitor C is coupled to a wiring line L which mutually connects the ECL circuits 1. As the wiring line L is lengthened, the wiring load capacitor C increases. An increase in the wiring load capacitor C causes a delay time of the signal transmission. That is, it takes a long time to transmit the output signal between the ECL circuits. Conventionally, in order to reduce the delay time, the constant-current source I2 is designed to allow a large amount of current to pass through the emitter follower transistor Tr3. In a case where a resistor is substituted for the constant-current source I2, the resistor is designed to have a small resistance value.

Generally, each ECL circuit in a semiconductor integrated circuit consumes a large amount of electrical power, and thus a large amount of power is consumed in the entire semiconductor integrated circuit. In addition, the existence of the large wiring load capacitors C further increases the power consumption of the entire semiconductor integrated circuit.

SUMMARY OF THE INVENTION

It is a general object of the present invention to provide an improved semiconductor integrated circuit having ECL circuits in which the above-mentioned disadvantages are eliminated.

A more specific object of the present invention is to provide a semiconductor integrated circuit having ECL circuits in which an increase in the consumed power is suppressed, the delay time caused by load capacitances is reduced, and the size of the semiconductor integrated circuit is reduced.

The above-mentioned objects of the present invention are achieved by a semiconductor integrated circuit comprising:

an emitter-coupled logic circuit coupled between a first power source line and a second power source line, the emitter-coupled logic circuit having a differential circuit and an output buffer circuit, the differential circuit having a first input terminal supplied with an input voltage, a second input terminal supplied with a first reference voltage, and an output terminal, and the output buffer circuit having a first transistor having a base connected to the output terminal of the differential circuit, a collector connected to the first power source line and an emitter;

a wiring line coupled to the emitter of the first transistor and carrying an output signal of the emitter-coupled logic circuit to a circuit of a next stage;

a second transistor having an emitter coupled to the emitter of the first transistor, a collector coupled to the first power source line, and a base supplied with a second reference voltage; and a constant-current source coupled to the emitter of the first and second transistors and allowing a constant current to selectively pass through either the first transistor or the second transistor, wherein a current switching circuit is formed by the first and second transistors and the constant-current source, and the constant current passes through either the first transistor or the second transistor on the basis of a potential of the base of the first transistor and the second reference voltage applied to the base of the second transistor.

The aforementioned objects of the present invention are also achieved by a semiconductor integrated circuit device comprising:

an emitter-coupled logic circuit coupled between a first power source line and a second power source line, the emitter-coupled logic circuit having a differential circuit and an output buffer circuit, the differential circuit having a first input terminal supplied with an input voltage, a second input terminal supplied with a first reference voltage, and an output terminal, and the output buffer circuit having a transistor having a base connected to the output terminal of the differential circuit, a collector connected to the first power source line and an emitter;

a wiring line coupled to the emitter of the first transistor and carrying an output signal of the emitter-coupled logic circuit to a circuit of a next stage; and current switching means, having a first current path including the first transistor, and a second current path, and coupled to the wiring line, for selectively allowing a constant-current to pass either the first current path or the second current path on the basis of a relationship between a potential of the output terminal of the differential circuit and a second reference voltage, so that the input voltage applied to the first input terminal is transferred to the circuit of the next stage by switching the constant current between the first current path and the second current path.

BRIEF DESCRIPTION OF THE DRAWINGS

Other objects, features and advantages of the present invention will become more apparent from the following detailed description when read in conjunction with the accompanying drawings, in which:

FIG. 1 is a circuit diagram of a conventional semiconductor integrated circuit having ECL circuits;

DESCRIPTION OF THE PREFERRED EMBODIMENTS

A description will now be given of the outline of the present invention with reference to FIG. 2, in which those parts which are the same as shown in FIG. 1 are given the same reference numerals.

Figure 2:
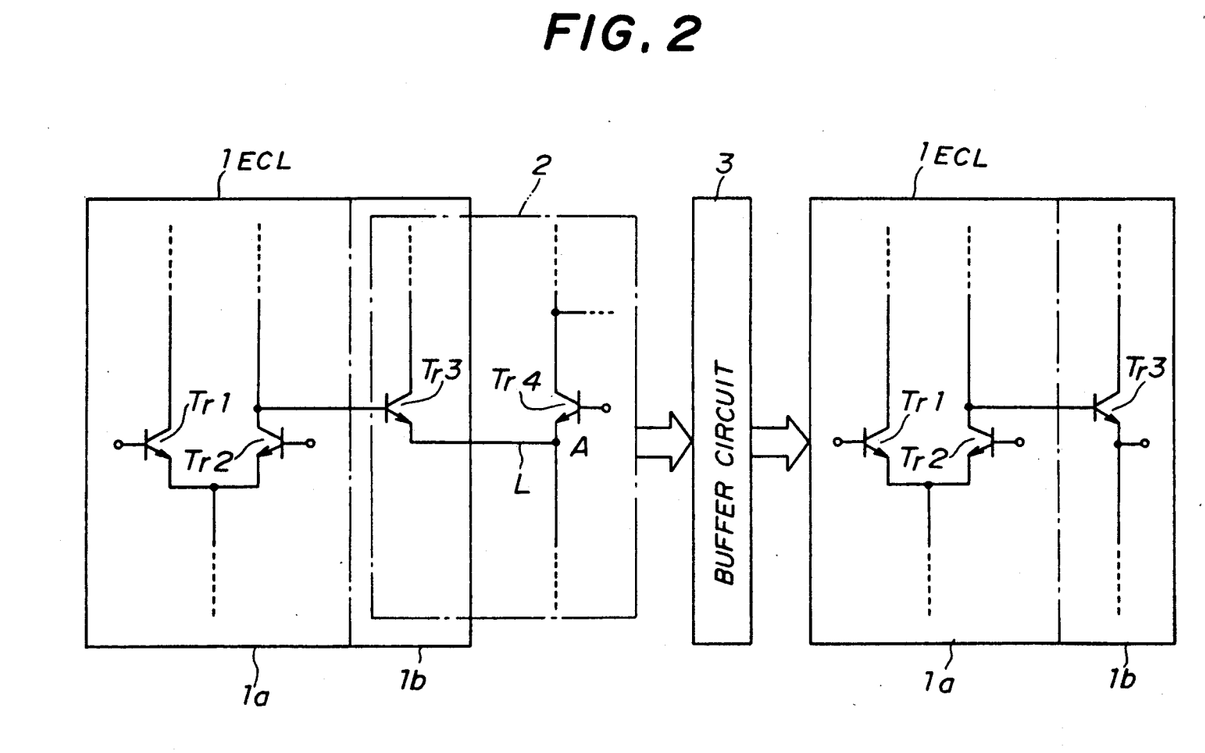
FIG. 2 is a block diagram illustrating an outline of the present invention.

Referring to FIG. 2, there are illustrated two ECL circuits 1 of first and second stages. Each of the ECL circuits 1 is composed of the differential circuit 1a including the two emitter-coupled transistors Tr1 and Tr2, and the output buffer circuit 1b including the emitter follower transistor Tr3. According to the present invention, a current switching circuit 2 and a buffer circuit 3 are provided between the differential circuit 1a. The current switching circuit 2 is composed of the transistor Tr3 of the output buffer circuit 1b and a transistor Tr4, which are emitter-coupled. That is, the current switching circuit 2 is configured by providing the transistor Tr4. In response to the output signal of the differential circuit 1a of the ECL circuit 1, current is switched and allowed to pass through either the transistor Tr3 or Tr4. The buffer circuit 3 detects the switching of the current passing through the current switching circuit 2, and outputs a detection signal to the ECL circuit 1 of the second stage.

In response to the output signal of the differential circuit 1a, the operations of the transistors Tr3 and Tr4 are switched, so that the current passing through one of the transistors Tr3 and Tr4 is switched and passes through the other one of the transistors Tr3 and Tr4. Even when the current is switched, the amount of the current obtained at a node A does not change greatly. Thus, a small change of the potential of the node A is obtained. Since the change of the potential of the node A is small, the capacitance of the wiring load capacitor C coupled to the wiring line L extending from the emitter of the transistor Tr3 to the emitter of the transistor Tr4 is considered to be substantially small. As a result, it becomes possible to suppress the delay time caused by the wiring load capacitance C. If the potential of the node A changes greatly, the node A will be greatly affected by the existence of the wiring load capacitor C.

Figure 3:
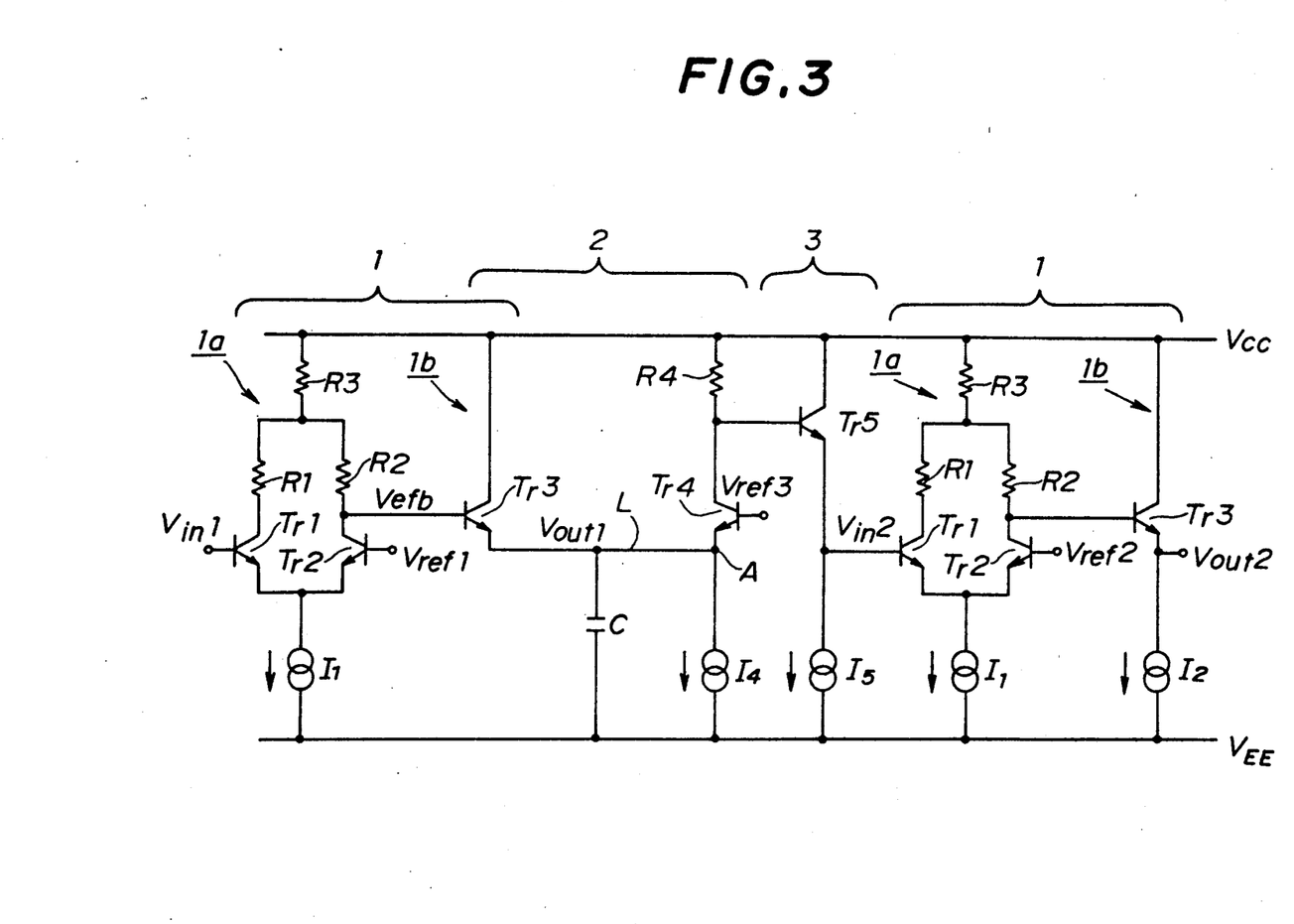
FIG. 3 is a circuit diagram of a first preferred embodiment of the present invention.

Referring to FIG. 3, there is illustrated the first preferred embodiment of the present invention. In FIG. 3, those parts which are the same as those shown in the previous figures are given the same reference numerals. The current switching circuit 2 is composed of the transistors Tr3 and Tr4, a resistor R4 and a constant-current source I4. The resistor R is connected to the power source line $V_{CC}$ and the collector of the transistor Tr4. The constant-current source I4 is connected between the emitter of the transistor Tr4 and the power source line $V_{EE}$. The emitter of the transistor Tr4 is coupled to the emitter of the transistor Tr3 via the wiring line L having a long length. The wiring load capacitor C is coupled to the wiring line L. It should be noted that the transistor Tr4 is located on the side of the ECL circuit 1 of the second stage illustrated on the right side of the drawing. It should also be noted that the constant-current source I4 is provided on the side of the ECL circuit of the second stage. In other words, the emitter of the transistor Tr3 is connected to the constant-current source I4 via the wiring line L. A reference voltage Vref3 is applied to the base of the transistor Tr4. The reference voltage Vref3 is set within the amplitude range of the output voltage Vefb obtained at the collector of the transistor Tr2, for example, a mean level between the maximum and minimum amplitude levels of the output voltage Vefb.

The output buffer circuit 3 is composed of a transistor Tr5 and a constant-current source I5. The collector of the transistor Tr5 is connected to the power source line $V_{CC}$, and the base thereof is connected to the collector of the transistor Tr4 of the current switching circuit 2. The emitter of the transistor Tr5 is connected to the constant-current source I5, and the base of the transistor Tr1 of the ECL circuit of the second stage.

In operation, when the output voltage Vefb applied to the base of the emitter follower transistor Tr3 of the ECL circuit of the first stage changes from the high level to the low level, the emitter follower transistor Tr3 is turned OFF, and the transistor Tr4 is turned ON. The current input to the constant-current source I4 comes from the transistor Tr4 in place of the emitter follower transistor Tr3. During this operation, the current path directed to the constant-current source I4 is only switched from the transistor Tr3 to the transistor Tr4. Thus, a variation in the potential of the node A is equal to only the difference between the high level of the output voltage Vefb and the reference voltage Vref3 applied to the base of the transistor Tr4. The affect of the wiring load capacitor C by a change of the output voltage Vout1 is suppressed, as compared with the conventional arrangement shown in FIG. 1. As a result, the response characteristic of the transistor Tr4 is enhanced.

When the transistor Tr4 turns ON and the current passes through the resistor R4, the potential of the base of the transistor Tr5 decreases and the potential of the emitter of the transistor Tr5 also decreases. Thus, the input voltage Vin2 applied to the base of the transistor Tr1 of the second stage becomes lower than the reference voltage Vref2. Then, the output buffer circuit 1b of the ECL circuit of the second stage outputs the low-level output voltage Vout2.

On the other hand, when the output voltage Vefb of the differential circuit 1a of the first stage changes from the low level to the high level, the emitter follower transistor Tr3 is turned ON, and the transistor Tr4 is turned OFF. Thus, the current input to the constant-current source I4 comes from the emitter follower transistor Tr3 in place of the transistor Tr4. During this operation, the current pass directed to the constant-current source I4 is only switched. Thus, a small variation in the potential of the node A is obtained, and thus the affect by the wiring load capacitor C is suppressed. As a result, the response characteristic of the transistor Tr4 is enhanced.

When the transistor Tr4 turns OFF so that no current passes through the resistor R4, the potential of the base of the transistor Tr5 increases, and the potential of the base of the transistor Tr5 also increases. Thus, the input voltage Vin2 becomes higher than the reference voltage Vref2. Then, the output voltage Vout2 of the second ECL circuit 1 becomes the high level.

As described above, according to the first preferred embodiment, the transistors Tr3 and Tr4 are emitter-coupled, and the output signal of the differential circuit 1a of the ECL circuit 1 is carried out by switching the current passing through the current switching circuit 2 having two current paths respectively having the transistors Tr3 and Tr4. With this arrangement, it becomes possible to suppress a variation in the potential at the node A irrespective of the existence of the wiring load capacitor C coupled to the wiring line L having a long length. As a result, the circuit operates as if the wiring load capacitor C is reduced, so that the affect of the wiring load capacitor C is suppressed. As a result, the signal can be transmitted between the ECL circuits at a high speed. In addition, it is possible to increase the operating speed of the circuit without increasing the current passing through the constant-current source I2 shown in FIG. 1. As a result, it is possible to reduce electrical power consumed in the entire circuit. Although the current sources provided in the circuit shown in FIG. 3 are more than those used in the circuit shown in FIG. 1, the current sources I4 and I5 shown in FIG. 3 do not need large amounts of currents. On the other hand, the current source I2 shown in FIG. 1 is needed to provide a large amount of current in order to increase the operating speed of the circuit. Thus, the total power consumed in the circuit shown in FIG. 3 is less than that in the circuit shown in FIG. 1.

It is possible to locate the constant-current source I4 on the side of the transistor Tr3. That is, the emitter of the transistor Tr4 is coupled to the constant-current source I4 via the wiring line L. This arrangement is superior to the conventional arrangement shown in FIG. 1. However, it is preferable to arrange the constant-current source I4 on the side of the transistor Tr4, as shown in FIG. 3.

Figure 4:
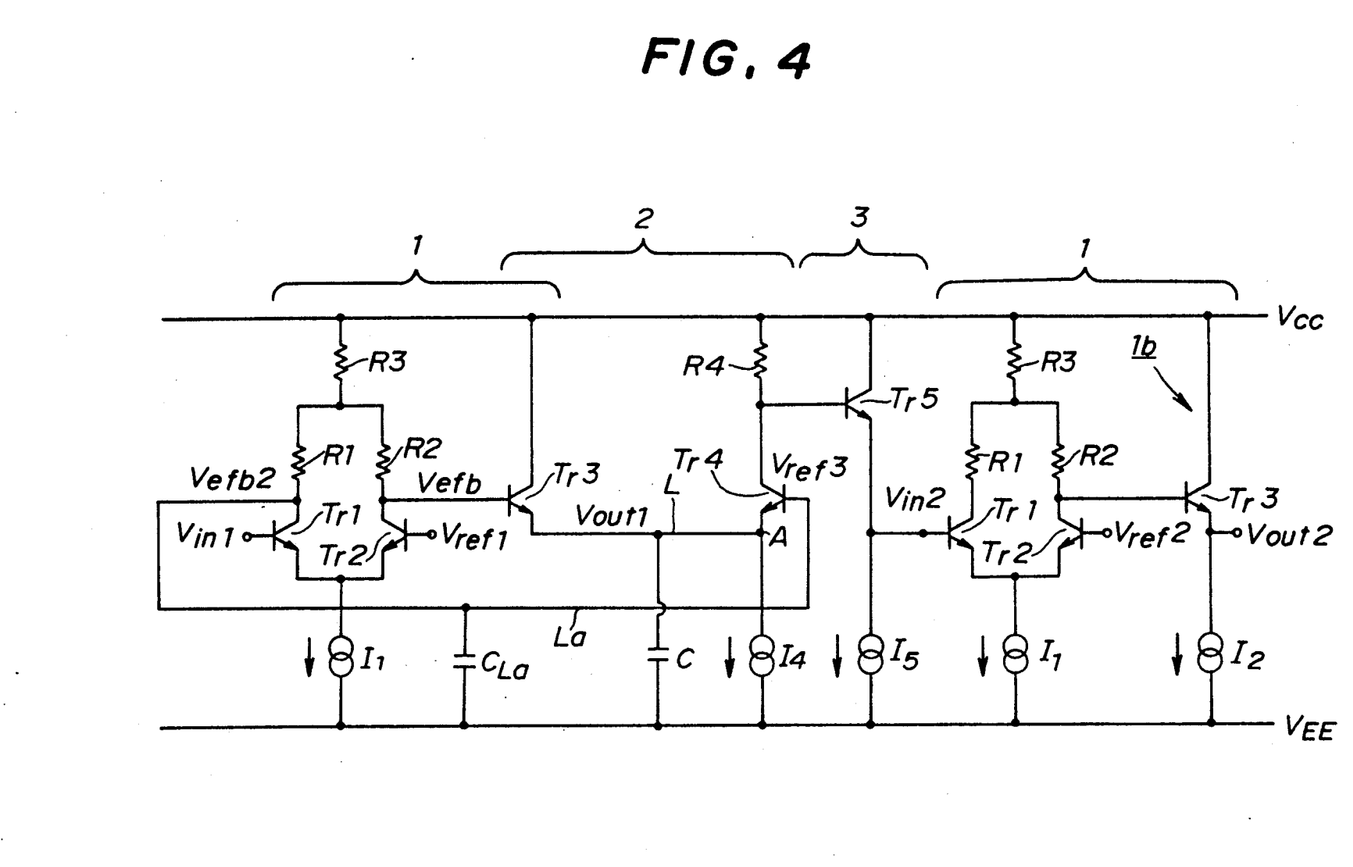
FIG. 4 is a circuit diagram of a second preferred embodiment of the present invention.

A description will now be given of a second preferred embodiment of the present invention with reference to FIG. 4, in which those parts which are the same as those shown in the previous figures are given the same reference numerals. The base of the transistor Tr4 of the current switching circuit 2 shown in FIG. 4 is connected to the collector of the transistor Tr1 of the differential circuit 1a of the first stage via a reference signal wiring line La. That is, the reference voltage Vref3 applied to the base of the transistor Tr4 is a collector voltage Vefb2 of the transistor Tr1. The reference voltage Vref3 (=Vefb2) is opposite to the output voltage Vefb input to the emitter follower transistor Tr3. Thus, the potential of the node A is always based on the output voltage Vefb and the voltage Vefb2. Thus, a variation in the potential of the node A is further compressed, as compared with the circuit shown in FIG. 3.

Figure 5:
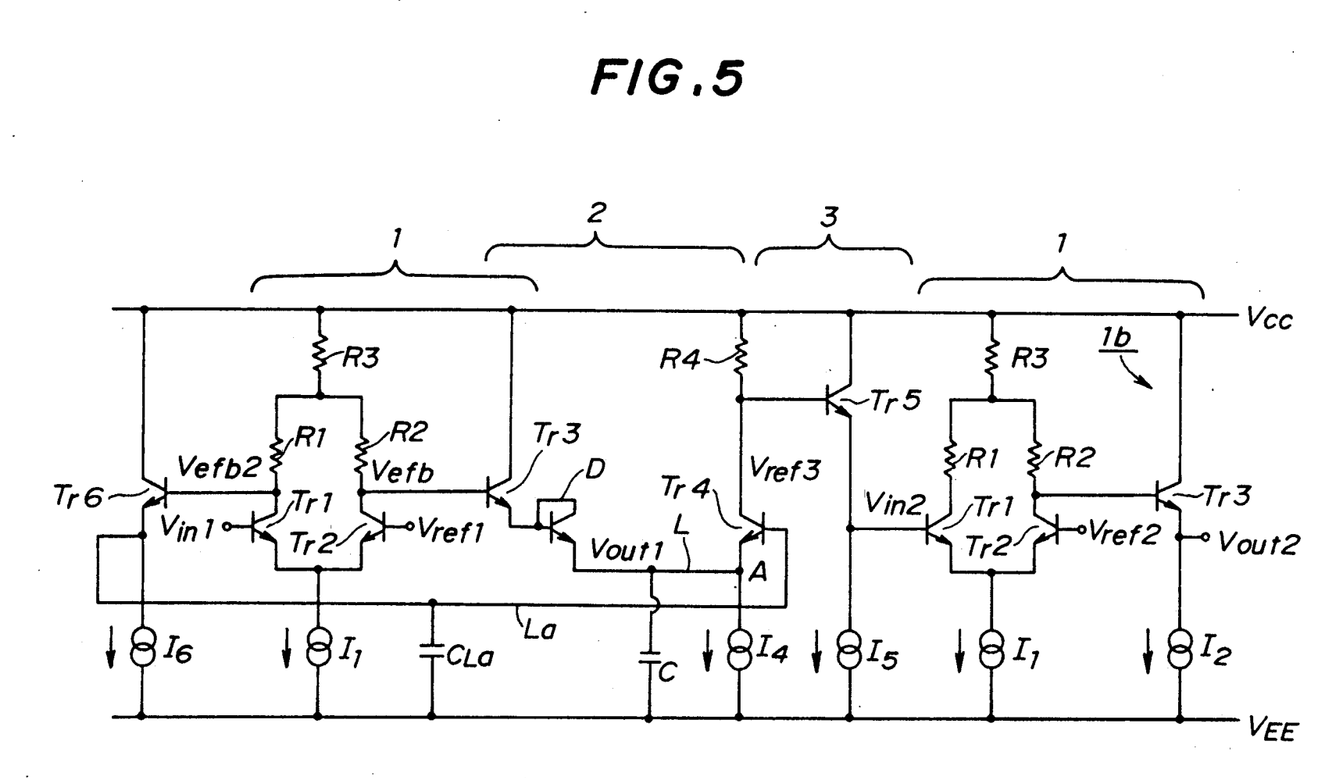
FIG. 5 is a circuit diagram of a third preferred embodiment of the present invention.

A description will now be given of a third preferred embodiment of the present invention with reference to FIG. 5, in which those parts which are the same as those shown in the FIG. 4 are given the same reference numerals. The circuit arrangement shown in FIG. 5 corresponds to a modification of the circuit arrangement shown in FIG. 4. The third embodiment of the present invention shown in FIG. 5 takes into account a wiring load capacitance $C_{La}$ coupled to the reference signal wiring line La. The circuit shown in FIG. 5 is configured by adding a transistor Tr6, a constant-current source I6 and a diode-connected transistor D.

The base of the transistor Tr6 is connected to the collector of the transistor Tr1, and the collector of the transistor Tr6 is connected to the power source line $V_{CC}$. The emitter of the transistor Tr6 is connected to the base of the transistor Tr4 via the wiring line La. The emitter of the transistor Tr6 is also connected to the constant-current source I6. The diode-connected transistor D has a base connected to the emitter of the transistor Tr3, and the emitter connected to the emitter of the transistor Tr4. It will be noted that a buffer circuit composed of the transistor Tr6 and the constant-current source I6 is provided. The voltage Vefb2 is sent to the base of the transistor Tr4 via the buffer circuit and the wiring line La. The diode-connected transistor D is provided for compensating for a voltage drop developed across the transistor Tr6.

The present invention is not limited to the specifically disclosed embodiments, and variations and modifications may be made without departing from the scope of the present invention.

What is claimed is:

1. A semiconductor integrated circuit connectable to a first power source line and a second power source line comprising:
   an emitter-coupled logic circuit connectable between the first power source line and the second power source line, said emitter-coupled logic circuit including a differential circuit and an output buffer circuit,
      said differential circuit having a first input terminal connected to receive an input voltage, a second input terminal connected to receive a first reference voltage and an output terminal, and
      said output buffer circuit having a first transistor having a base connected to the output terminal of said differential circuit, a collector connectable to the first power source line and an emitter;
   a wiring line coupled to the emitter of said first transistor and carrying an output signal of the emitter-coupled logic circuit to a circuit of a next stage;
   a second transistor having an emitter coupled to the emitter of said first transistor, a collector connectable to the first power source line, and a base connected to receive a second reference voltage;
   a first constant-current source coupled to the emitters of said first and second transistors and allowing a constant current to selectively pass through one of said first transistor and said second transistor; and buffer means for determining whether the first constant current passes through said first transistor or said second transistor and for outputting a voltage signal showing whether or not the first constant current passes through said first transistor or said second transistor;

wherein a current switching circuit is formed by said first and second transistors and said first constant-current source, and the first constant current passes through one of said first transistor and said second transistor based on a potential of the base of said first transistor and the second reference voltage applied to the base of said second transistor.

2. A semiconductor integrated circuit connectable to a first power source line and a second power source line comprising:

a first emitter-coupled logic circuit connectable between the first power source line and the second power source line, said emitter-coupled logic circuit including a differential circuit and an output buffer circuit, said differential circuit having a first input terminal connected to receive an input voltage, a second input terminal connected to receive a first reference voltage and an output terminal, and said output buffer circuit having a first transistor having a base connected to the output terminal of said differential circuit, a collector connectable to the first power source line and an emitter;

a wiring line coupled to the emitter of said first transistor and carrying an output signal of the emitter-coupled logic circuit to a circuit of a next stage;

a second transistor having an emitter coupled to the emitter of said first transistor, a collector connectable to the first power source line, and a base connected to receive a second reference voltage;

a first constant-current source coupled to the emitters of said first and second transistors and allowing a first constant current to selectively pass through one of said first transistor and said second transistor;

said differential circuit comprising:

a third transistor having a collector connectable to the first power source line, a base corresponding to said first input terminal, and an emitter;

a fourth transistor having a collector connectable to the first power source line and connected to the base of the first transistor, a base corresponding to the second input terminal, and an emitter coupled to the emitter of said third transistor; and a second constant-current source connectable to the second power source line and connected to the emitters of said third and fourth transistors, to allow a second constant current to pass through one of said third transistor and said fourth transistor based on the input voltage and the first reference voltage; and a reference signal wiring line which mutually couples the collector of said third transistor and the base of said second transistor;

wherein a current switching circuit is formed by said first and second transistors and said first constant-current source, and said constant current passes through one of said first transistor and said second transistor based on a potential of the base of said first transistor and said second reference voltage applied to the base of said second transistor.

3. A semiconductor integrated circuit as claimed in claim 2, wherein the emitter of said first transistor is coupled to said first constant-current source via said wiring line.

4. A semiconductor integrated circuit as claimed in claim 2, further comprising buffer means for transferring the potential of the collector of said third transistor to the base of said second transistor via said reference voltage wiring line.

5. A semiconductor integrated circuit as claimed in claim 4, wherein said buffer means comprises:

a fifth transistor having a collector connectable to the first power source line, a base connected to the collector of said third transistor, and an emitter coupled to the base of said second transistor; and third constant-current source connected to the emitter of said fifth transistor and connectable to the second power source line, to allow a third constant current to pass through said fifth transistor.

6. A semiconductor integrated circuit as claimed in claim 5, further comprising level adjustment means, connected between the emitter of said first transistor and the emitter of said second transistor, for decreasing a potential of the emitter of said first transistor by a predetermined level.

7. A semiconductor integrated circuit as claimed in claim 6, wherein the emitter of said second transistor is coupled to said level adjustment means via said wiring line.

8. A semiconductor integrated circuit as claimed in claim 6, wherein said level adjustment means comprises a diode-connected transistor having a collector, a base connected to said collector and the emitter of said first transistor, and an emitter coupled to the emitter of said second transistor.

9. A semiconductor integrated circuit as claimed in claim 2 further comprising:

a resistor connectable to the first power source and connected to the collector of said second transistor;

an emitter follower transistor having a collector connectable to the first power source, a base connected to the collector of said second transistor, and an emitter connected to the circuit of the next stage; and fourth constant-current source connected to the emitter of said emitter follower transistor and connectable to the second power source line, to allow a fourth constant current to pass through said emitter follower transistor.

10. A semiconductor integrated circuit as claimed in claim 2, further comprising:

buffer means for determining whether the first constant current passes through said first transistor or said second transistor and for outputting a voltage signal showing whether or not the first constant current passes through said first transistor or said second transistor; and an ECL circuit having an input terminal supplied with the voltage signal, and an output terminal.

11. A semiconductor integrated circuit as claimed in claim 2, wherein said second reference voltage is between a maximum potential and a minimum potential obtained at the output terminal of said differential circuit.

12. A semiconductor integrated circuit as claimed in claim 2, further comprising:

a first resistor coupled to the collector of said third transistor;

a second resistor coupled to the collector of said fourth transistor; and a third resistor coupled between said first power source line and the collectors of said third and fourth transistors.

* * * * *

UNITED STATES PATENT AND TRADEMARK OFFICE
CERTIFICATE OF CORRECTION

PATENT NO. : 5,130,573

DATED : July 14, 1992

INVENTOR(S) : NAWA, et al.

It is certified that error appears in the above-indentified patent and that said Letters Patent is hereby corrected as shown below:

TITLE PAGE-   [73] after "Fujitsu Limited, Kawasaki, Japan" insert --and Fujitsu VLSI Limited, Aichi, Japan--.

Signed and Sealed this

Eighth Day of March, 1994

Attest:

BRUCE LEHMAN

*Attesting Officer*                *Commissioner of Patents and Trademarks*